United States Patent [19]

Hines

[11] 4,209,745

[45] Jun. 24, 1980

[54] INTERCHANGEABLE TEST HEAD FOR LOADED TEST MEMBER

[75] Inventor: Clyde K. Hines, Arcadia, Calif.

[73] Assignee: Everett/Charles, Inc., Pomona, Calif.

[21] Appl. No.: 914,726

[22] Filed: Jun. 12, 1978

[51] Int. Cl.$^2$ .................. G01R 31/02; H01R 3/04
[52] U.S. Cl. ................. 324/158 F; 324/73 PC;
 324/158 P; 339/117 P
[58] Field of Search .......... 324/158 F, 158 P, 73 PC,
 324/73 AT, 73 R, 72.5; 339/117 P, 18 R

[56] References Cited

U.S. PATENT DOCUMENTS

| | | | |
|---|---|---|---|
| 3,016,489 | 1/1962 | Briggs et al. | 324/158 F |
| 3,493,858 | 2/1970 | Baron et al. | 324/72.5 |
| 3,596,228 | 7/1971 | Reed, Jr. et al. | 324/158 P |
| 3,654,585 | 4/1972 | Wickersham | 324/158 F |
| 3,757,219 | 9/1973 | Aksu | 324/158 F |
| 3,942,778 | 3/1976 | Fadiga et al. | 324/73 PC |
| 4,017,793 | 4/1977 | Haines | 324/158 F |
| 4,138,186 | 2/1979 | Long et al. | 324/158 P |

OTHER PUBLICATIONS

Drawing No. PFU-3000; "Vacuum Fixture;" Pylon Co. Inc., Attleboro, Mass.; 10-1977.

*Primary Examiner*—Rudolph V. Rolinec
*Assistant Examiner*—Ernest F. Karlsen
*Attorney, Agent, or Firm*—Christie, Parker & Hale

[57] ABSTRACT

An interchangeable test head for a vacuum fixture for testing a loaded planar test member. The test head includes support means comprising a planar support surface. A platform is in opposed relation to the planar support surface and has a planar test member surface. Resilient seal means is affixed to the platform and is flared outwardly around the perimeter of the platform to a free edge which engages and forms a vacuum seal with the planar support surface thereby providing a vacuum chamber between the platform and the support means. Stop means limits the deactuated position of the platform so that the entire free edge of the seal means remains in engagement with the planar support surface. Vacuum in the chamber causes the platform to move along the path from the deactuated position to the actuated position. A plurality of spaced spring probes is mounted on the support means. A plurality of openings is provided through the platform for drawing a test member against the spring probes.

2 Claims, 5 Drawing Figures

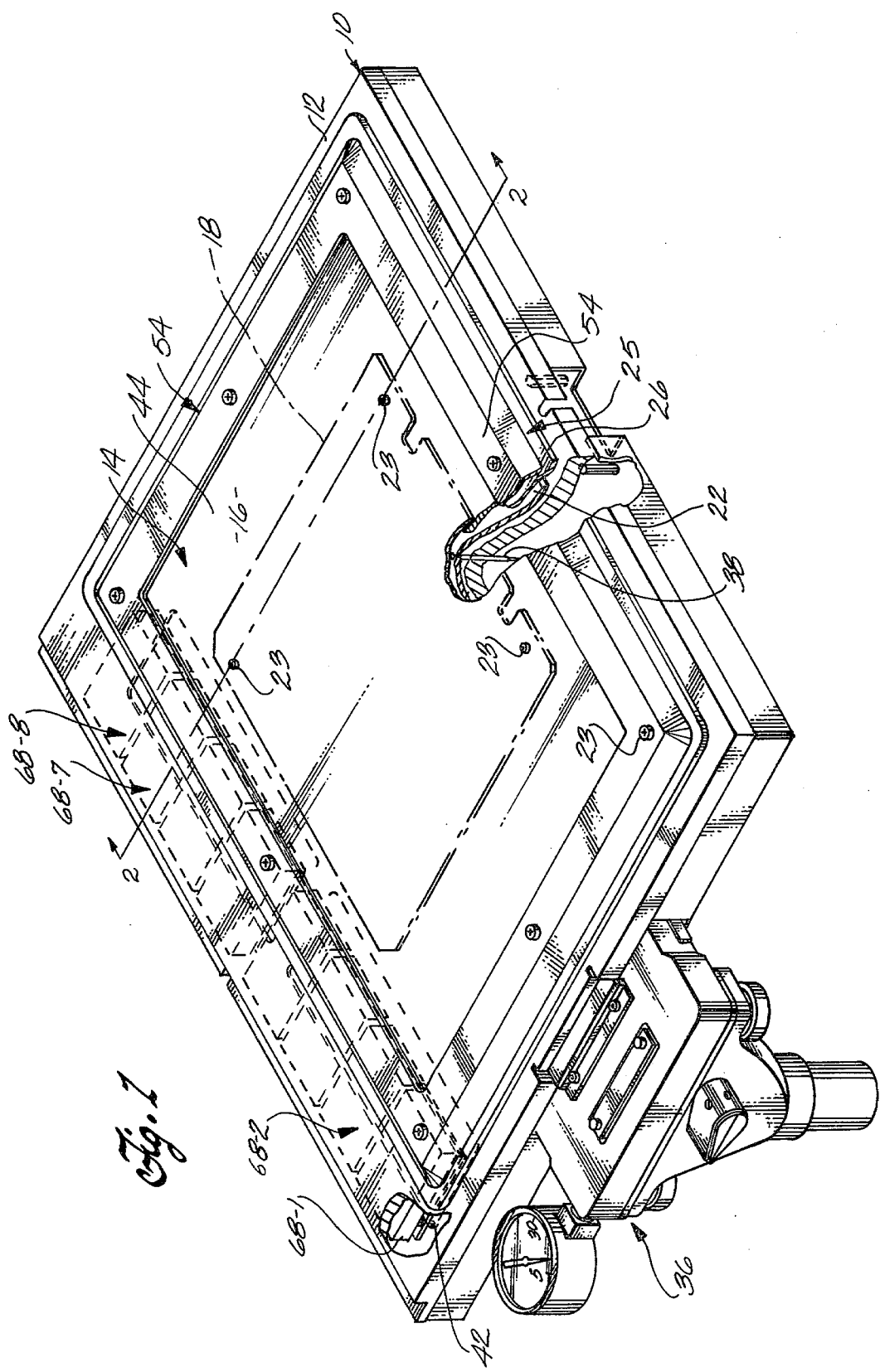

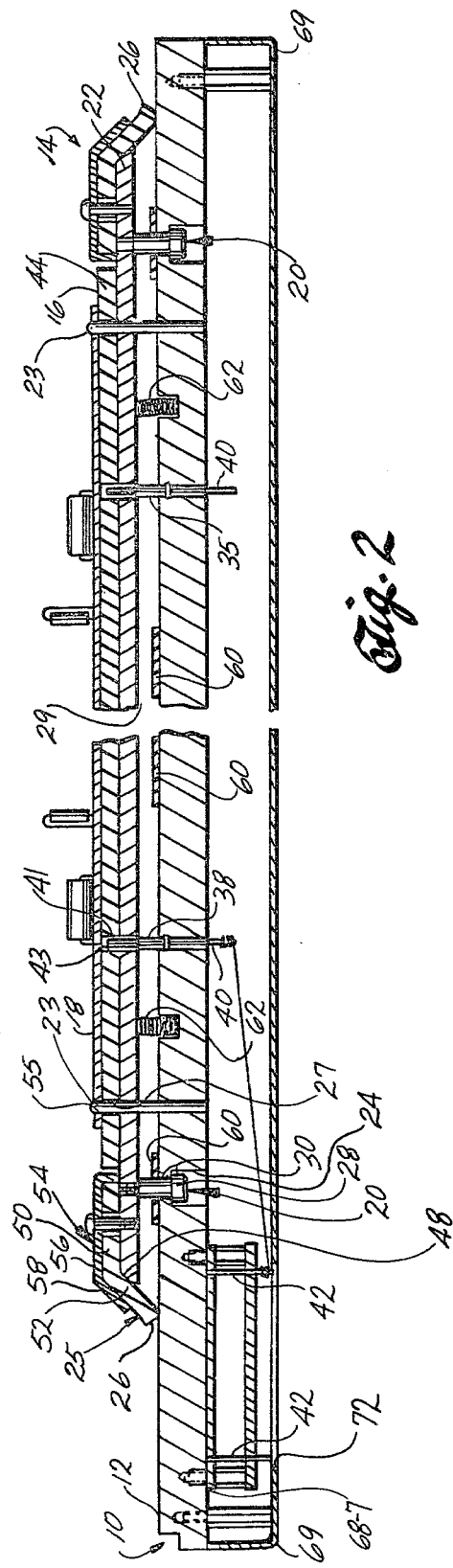

INTERCHANGEABLE TEST HEAD FOR LOADED TEST MEMBER

BACKGROUND OF THE INVENTION

This invention relates to apparatus for actuating a plurality of electrical spring probes and a loaded planar test member into electrical contact.

Circuit board analysers are generally known employing an actuator assembly for relatively moving a plurality of electrical spring probes and a circuit board, bearing test points, into electrical contact.

One class of actuator assemblies actuates a bare board and the electrical spring probes into contact. A bare board is a circuit board, for example a printed circuit board, which does not have components loaded on the board. This bare board class of actuator assemblies generally utilizes a backing on the opposite side of the board from the electrical spring probes which keeps the board generally planar so that it makes electrical contact with all of the electrical spring probes and forms one wall of a vacuum chamber. An example of this bare board class of actuator assemblies is disclosed in co-pending application U.S. Ser. No. 851,847, now U.S. Pat. No. 4,138,186, filed Nov. 16, 1977. The co-pending patent application discloses a test apparatus for a bare planar test member. Included is a test member support plate. A movably mounted door plate provides access to a test location on the support plate. A resilient seal is mounted on the door plate and extends in sealing relation between the door plate and the support plate around the perimeter of the test location when the door plate is closed so as to form a resilient mounting for the door plate on the support plate. The sealing relation between the seal and the support plate is broken when the door plate is opened. A substantially sealed cavity includes the test location and comprises the support plate, the door plate and the seal. A plurality of probes are mounted on and extend through the support plate and each comprises a resiliently biased probe head exposed in the cavity. Ports for vacuum extend through the support plate to the vacuum chamber.

Such a device is not suitable for testing of loaded boards. Loaded boards are, for example, printed circuit boards which have components such as resistors, capacitors, etc., mounted on one side of the board. Since the loaded board must be inserted between the door plate and the test member support plate, the components prevent the door plate from making cntact with the surface of the printed circuit board.

Another class of actuator assemblies and the one to which the present invention is directed actuates a loaded board and electrical spring probes into contact. Loaded board actuable assemblies differ from the bare board class discussed above in that a backing cannot be used on the opposite side of the loaded board from the probes because of the components mounted on the board.

An example of a loaded board actuator assembly is disclosed in U.S. Pat. No. 4,017,793. The '793 patent discloses a printed circuit board tester which has an elastomeric member on which a loaded printed circuit board is positioned. The circuit board is supported on the elastomeric member by a thin nonconductive sealing foam sheet that has a cutaway central portion to permit the circuit board to makecontact with leads which extend through openings in the elastomeric member. The elastomeric member is in turn mounted on a rigid fiber glass plate or sheet which is positioned in opposed relation to a base member in which the leads are mounted. A diaphragm extends across the surface of the rigid fiber glass sheet on the opposite side from the base support and extends outwardly beyond the edges of the fiber glass sheet to the base member, thereby providing a vacuum chamber between the fiber glass sheet and the base member. A rectangular picture frame shaped molded fiber glass retainer extends over the edges of the elastomeric diaphragm and sealingly secures the perimeter of the diaphragm to the base member. Coil compression springs urge the fiber glass sheet away from the base until the elastomeric member is stopped against an inner edge of the retainer. A rectangular opening in the center of the retainer provides access for the loaded printed circuit board. Additionally, spacers are provided between the fiber glass sheet and the base. Evacuation of the vacuum chamber causes the fiber glass sheet and the printed circuit board to be drawn down against the leads. Such an arrangement is rather costly to manufacture due to the number of parts and the required assembly process.

Other loaded board actuator assemblies are also known. Some of these devices require that the printed circuit board be fixed and that the base support for the spring probes be moved upwardly to bring the spring probes into contact with the loaded printed circuit board under test.

SUMMARY OF THE INVENTION

Briefly, an embodiment of the present invention is an interchangeable test head for a vacuum fixture for testing a loaded planar test member. The test head includes support means comprising a planar support surface. A platform is in opposed relation to the planar support surface and has a planar test member surface against which such a planar test member can be positioned. Guide means guides the platform along a path with the planar test member surface oriented facing away from and substantially parallel with the planar support surface. The path is from a deactuated to an actuated position. Resilient seal means is affixed to the platform and is flared outwardly around the perimeter of the platform to a free edge which engages and forms a vacuum seal with the planar support surface thereby providing a vacuum chamber between the platform and the support means. Stop means limits the deactuated position of the platform so that the entire free edge of the seal means remains in engagement with the planar support surface. A vacuum passage is provided to the vacuum chamber. Vacuum in the chamber causes the platform to move along the path from the deactuated position to the actuated position in a direction which is toward the planar support surface. A plurality of spring probes are spaced apart and are mounted on the support means. Each of the spring probes extends through the platform to such a test member when the actuated condition of the platform exists and also extends through the support means to a connector end. A plurality of openings are provided through the platform to such a test member thereby drawing the test member against the spring probes. The portion of the seal means which is flared outwardly collapses, allowing the platform to be drawn toward the planar support surface while maintaining the vacuum chamber. The planar test member surface comprises a resilient material for sealing the platform to such a test member around the plurality of openings.

Preferably the platform comprises a plate and preferably the support means also comprises a plate.

Preferably one or more spacers are positioned between the platform and the planar support surface to thereby prevent contact between the platform and planar support surface during actuation.

Preferably means is provided for normally and resiliently biasing the platform to the deactuated position away from the planar support surface.

Preferably the guide means comprises a plurality of guide posts extending between the support means and the platform.

Preferably a frame directs the seal means at an oblique angle toward the planar support surface. According to a preferred arrangement the frame has a portion that overlaps the outwardly flared portion of the seal means and the frame portion has an outer edge which is spaced from the free edge of the seal means to provide freedom for the seal means to collapse during actuation.

An interchangeable test head according to the present invention substantially reduces the cost of interchangeable test heads for loaded printed circuit boards compared with the prior art interchangeable test heads referred to hereinabove.

DESCRIPTION OF DRAWINGS

FIG. 1 is a perspective view of an interchangeable test head with portions broken away to reveal internal parts thereof and embodies the present invention;

FIG. 2 is a cross-sectional view of the interchangeable test head taken along the lines 2—2 of FIG. 1 showing the platform in the deactuated position. The mid portion of the interchangeable test head is broken out for ease of representation;

FIG. 3 is an enlarged cross-sectional view of the left hand portion of the interchangeable test head as depicted in FIG. 2 after vacuum has been applied and the plate is in the actuated position;

DESCRIPTION

Figure 4:
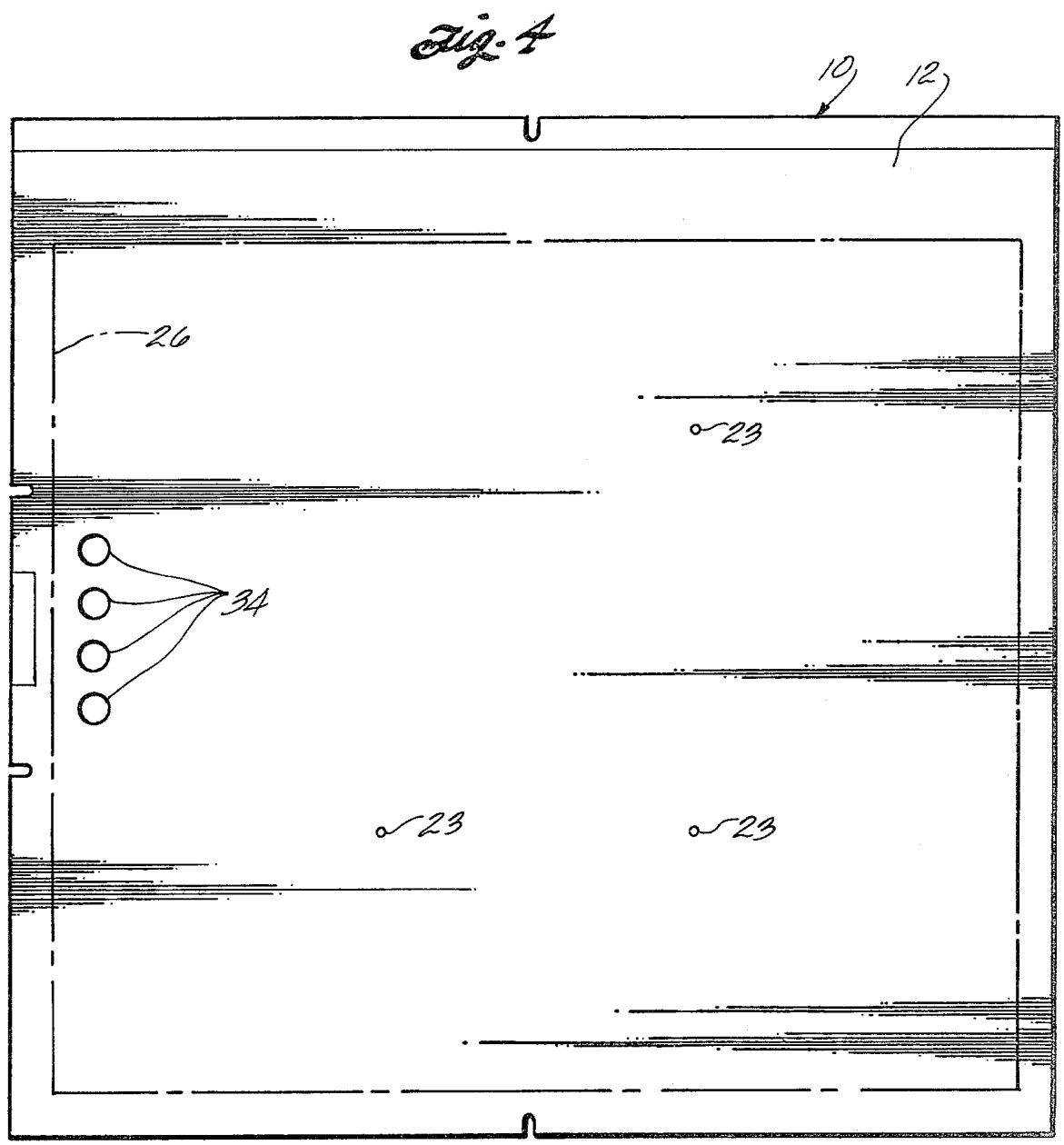
FIG. 4 is a plan view of the support plate for the interchangeable test head with the platform and flexible rubber seal removed.

FIGS. 1-5 depict an interchangeable test head for a vacuum fixture for testing a loaded planar test member and embody the present invention. The loaded planar test member is typically a printed circuit board with components whose leads have been soldered in place in plated through holes and which has test points on the opposite side from the components. Electrical connection and tests are to be made on the opposite side from the components.

Support means is provided for spring probes which make contact with the test points. The support means is preferably in the form of a rectangular support plate 10 having a generally planar upper support surface 12.

A platform 14 is positioned in opposed relation to the planar support surface 12 and has a planar test member surface 16 against which a planar test member can be positioned for test. By way of example, only the outline of a loaded printed circuit board 18 is depicted by long and short broken lines in FIG. 1. The printed circuit board with resistor and capacitor elements soldered in place is depicted in full line in FIG. 2.

Guide means is provided for guiding the platform along a path with the planar test member surface 16 oriented facing away from and substantially parallel with the planar support surface 12. The path is from the deactuated position depicted in FIG. 2 to the actuated position depicted in FIG. 3. More specifically, one of the guide means is in the form of a screw 20 (FIG. 2) having one end threaded into a plate 22 forming a part of the platform 14. The screw 20 is guided by the smaller diameter portion of a stepped opening 24 formed through the support plate 10.

Additional guide means is provided in the form of pins 23 (FIGS. 1, 2 and 3). The pins 23 have one end affixed in the support plate 10 and extend through openings 27 provided through the platform 14. The pins 23 sliding on the inner wall of holes 27 guide the platform as subsequently described in more detail.

Resilient seal means in the form of a flexible rubber seal 25 is affixed to the platform and is flared outwardly around the perimeter of the platform 14 to a free edge 26. The free edge 26 engages and forms a vacuum seal with the planar support surface 12. As a result the flexible rubber seal 25 provides a vacuum chamber 29 between the platform and the support surface 12.

Stop means is provided for limiting the deactuated position of the platform 14 along its path of travel so that the entire free edge 26 of the flexible rubber seal 25 always remains in engagement with the planar support surface 12. To this end a shoulder 28 is provided on each of the screws 10. The shoulder 28 engages a necked down portion 30 of the stepped opening 24 extending through the support plate 10.

Means is provided for a vacuum passage to the vacuum chamber. As best depicted in FIG. 4, four openings 34 extend through the support plate from top to bottom. A vacuum manifold 36 has a passage (not shown) which connects to the underside of the openings 34 through which the vacuum chamber is evacuated. As best depicted in FIG. 4, the openings 34 lie within the outer perimeter of the vacuum chamber and within the free edge 26 of the flexible rubber seal (indicated by broken line in FIG. 4).

To be explained in more detail, evacuation of the vacuum chamber causes the platform to move along the path from the deactuated position to the actuated position in a direction which is toward the planar support surface 12.

A plurality of electrical spring probes 38 are spaced apart and mechanically mounted on the support plate 10. Only two spring probes 38 are depicted in FIG. 3 by way of example. However, it will be understood that there is actually an array of spring probes one at each test point to be electrically contacted on the printed circuit board 18. Each of the spring probes 38 extends through the platform 14 to the lower side of the loaded printed circuit board 18 when the actuated condition of the platform exists as depicted in FIG. 3. Additionally each spring probe extends through the support plate 10 to an exposed connector end 40. To be explained in more detail, each of the connector ends 40 is electrically connected to a separate interface pin 42 which in turn is connected to an actuable interface assembly for connection to a circuit board verifier or the like.

A plurality of openings 43 are provided through the platform to permit vacuum in the vacuum chamber to reach the lower side of the loaded printed circuit board 18. The vacuum draws the printed circuit board 18 against the planar test member surface 16 and against the probe ends 41 of the spring probes 38.

Consider now the operation of the interchangeable test head. Initially the loaded printed circuit board 18 is appropriately positioned on the planar test member surface relative to the spring probes 38. The vacuum chamber 29 is then evacuated through the openings 34. Atmospheric pressure exists exteriorly to the vacuum chamber 29, forcing the printed circuit board and the platform toward the planar support surface 12 until the probe ends of the spring probes 38 engage the lower surface of the loaded printed circuit board 18. As the platform is forced toward the planar support surface 12, the flexible rubber seal 25 collapses as depicted in FIG. 3, thereby maintaining the vacuum seal between the flexible rubber seal and the planar support surface.

With the general construction of the interchangeable test head in mind, consider some of the other aspects of the interchangeable test head. The openings 43 are preferably the same holes through which the spring probes 38 pass through the platform 14. The openings 43 are distributed around the lower side of the loaded printed circuit board 18 and the openings 43 are made sufficiently large relative to the spring probes so that the downward force on the printed circuit board due to the vacuum is greater than the upward force applied by the spring probes. Care must be taken to distribute the openings 43 over the surface of the printed circuit board and to provide sufficient openings to the vacuum chamber so as to prevent the loaded printed circuit board from warping and/or bowing, due to the pressure of the spring probes. Such warping and/or bowing may (1) cause solder joints on the loaded printed circuit board to break and/or (2) prevent contact of one or more of the spring probes. In order to achieve this design objective it has been found necessary, in some instances, to provide more openings 43 than there are spring probes.

The planar test member surface 16 on the upper side of the platform 14 is preferably provided by a rubber mat 44 bonded to the upper surface of the plate 22 and which forms a part of the platform. The rubber mat 44 forms a resilient material for sealing the platform to the loaded printed circuit board 18 around each of the openings 43 thereby assuring the integrity of the vacuum chamber.

As best seen in FIG. 1 the platform 14 and also the plate 22 and the rubber mat 44 are generally rectangular and the flexible rubber seal 25 has a generally rectangular picture frame structure extending around the perimeter of the rubber mat 44. The upper corner of the plate 22 as seen in FIG. 2 is beveled as indicated at 48 completely around the perimeter of the plate. The flexible rubber seal 25 has one portion 50 mounted on and extending generally parallel with the upper surface of the plate 22, and a further portion 52 extending along the beveled edge 48 at an oblique angle to the first portion 50 (see FIG. 2). The flexible rubber seal 25 is held in place on the plate 22 by a substantially rigid frame 54. The frame is fabricated from metal, plastic or other suitable material. The frame 54 also has a generally rectangular picture frame construction (see FIG. 1) with one portion 56 clamping and sealing the flexible rubber seal portion 50 to the upper surface of the plate 22. The frame 54 also has a portion 58 extending at an oblique angle to the portion 56 and parallel with the beveled surface 48 thereby clamping the flexible rubber seal portion 52 against the beveled surface 48 and directing the flexible rubber seal portion 52 to the planar support surface 12. The frame portion 58 is shorter than the seal portion 52 thereby leaving the free edge 25 with sufficient flexibility and length to compress so that the printed circuit board moves through a sufficient distance to ensure that all probe heads of the spring probes are in electrical contact with the printed circuit board.

Spacers 60, preferably of neoprene, are positioned between the plate 22 of the platform and the planar support surface 12. The spacers 60 are glued or otherwise attached to the planar support surface 12 and are distributed around and below the lower surface of the plate 22 ensuring that the plate 22 does not contact the planar support surface 12 at any point when in the actuated condition depicted in FIG. 3. This is important in order to ensure that a vacuum exists evenly over the lower surface of the plate 22.

Means is also provided for normally and resiliently biasing the platform to the deactuated position depicted in FIG. 2. The resilient seal may provide this function. However, it is normally desirable to provide added resilient biasing. To this end, coil compression springs 62 extend between the support plate 10 and the lower surface of the plate 22, urging the plate 22 and hence the platform toward the fully deactuated position.

The pins 23 as discussed above form guide posts for guiding the platform along the path between the deactuated and actuated positions while maintaining the platform facing away from and substantially parallel with the planar support surface 12. By way of example, at least two pins 23 are positioned, each adjacent a different corner of the loaded printed circuit board 18. The pins 23 are also selected so that they extend through tooling holes 55 provided in the loaded printed circuit board 18 to thereby accurately orient the loaded printed circuit board 18 with respect to each of the spring probes 38. The openings around the screws 20 and the pins 23 are selected so that while at rest, during travel, and at all times along the path between actuated and deactuated positions, the platform 14 as well as the loaded printed circuit board 18 are kept in precise registration with the spring probes 38 to assure accurate contact with the desired points on the loaded printed circuit board for test.

As best depicted in FIG. 1, eight pin blocks 68-1 through 68-8 are provided along the back side of the interchangeable test head, only pin blocks 68-1, 68-2, 68-7 and 68-8 being numbered for simplicity. The pin blocks actually extend from the lower side of the interchangeable test head and therefore, except for 68-1, for which the platform has been broken away, the pin blocks are depicted by hidden line.

Referring to FIG. 2, each of the pin blocks 68 is the same and has a rectangular array of evenly spaced interface pins 42 with one end mounted in the pin block. The pin blocks in turn are rigidly mounted to the lower surface of the support plate 10. Each of the spring probes 38 is connected through a conductor by wire wrapping, soldering or other well known techniques to one of the interface pins 42 in one of the pin blocks. A cover 69 protects the wiring between the spring probes and the interface pins and has a rectangular opening 72 therein which exposes only the ends of the interface pins to allow connection to corresponding contacts in an actuable contact interface assembly.

Figure 5:
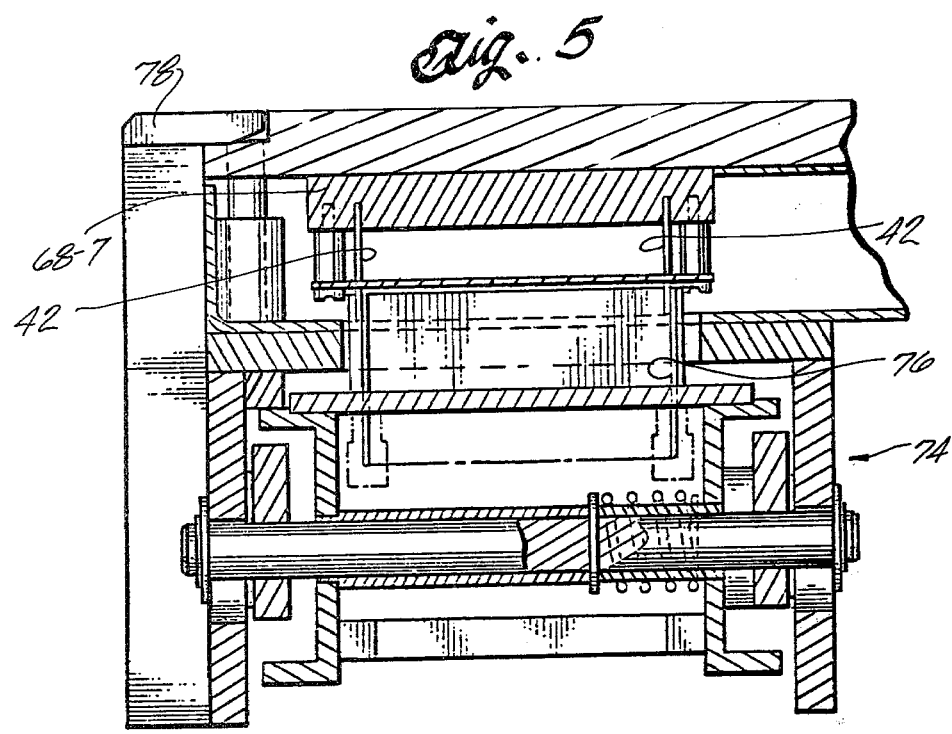
FIG. 5 is a view of the left hand portion of the interchangeable test head depicted in FIG. 2 showing an actuable interface assembly for making electrical contact with the interface pins.

FIG. 5 is an enlarged cross-sectional view of the left hand corner of the interchangeable test head depicted in FIG. 2 showing the interchangeable test head mounted in a support assembly 78 having an actuable interface assembly 74 having interface pins 76. One interface pin 76 is provided for each of the interface pins 42 in the pin block. The actuable interface assembly 74 actuates a different interface pin 76 into and out of electrical contact with each of the interface pins 42. Only two interface pins 42 are depicted in each of the pin blocks for simplicity. The details of an actuable interface assembly for use with the interchangeable test head of the present application are disclosed in detail in U.S. Pat. application Ser. No. 875,231 filed Feb. 6, 1978, the details of which are incorporated herein by reference.

The spring probes 38 may be one of a number of different types well known in the art. The spring probe used herein is that depicted in U.S. Pat. No. 4,050,762.

Preferably the support plate 10 and the plate 12 are made of an insulating material such as phenolic or any glass insulating material which is sufficiently rigid so as not to appreciably deform under the pressure of the spring probes acting against the loaded printed circuit board.

Although an exemplary embodiment of the invention has been disclosed for purposes of illustration, it will be understood that various changes, modifications and substitutions may be incorporated into such embodiment without departing from the spirit of the invention as defined by the claims appearing hereinafter.

What is claimed:

1. An interchangeable test head for a vacuum fixture for testing a loaded planar test member, the test head comprising:

support means comprising a planar support surface;

a platform in opposed relation to the planar support surface and having a planar test member surface against which such a planar test member can be positioned;

guide means for guiding the platform along a path with the planar test member surface oriented facing away from and substantially parallel with the planar support surface, the path being from a deactuated to an actuated position;

resilient seal means affixed to the platform and flared outwardly around the perimeter of the platform to a free edge which engages and forms a vacuum seal with the planar support surface thereby forming a wall of a vacuum chamber from at least the platform to the support means;

frame means mounted on the platform for directing the seal means at an oblique angle toward the planar support surface;

stop means for limiting the deactuated position of the platform so that the entire free edge of the seal means remains in engagement with the planar support surface;

means providing a vacuum passage to the vacuum chamber, vacuum in the chamber causing the platform to move along the path from the deactuated position to the actuated position in a direction which is toward the planar support surface;

a plurality of spring probes spaced apart and mounted on the support means, each of the spring probes extending through the platform to such a test member positioned against the planar test member surface when the actuated condition of the platform exists and also extending through the support means to a connector end; and a plurality of openings through the platform to permit vacuum in the chamber to be formed on a test member positioned against the planar test member surface thereby drawing the same against the spring probes.

2. An interchangeable test head according to claim 1 wherein the frame means has a portion in overlapping relation with the outwardly flared portion of the seal means and has an outer edge which is spaced from the free edge of the seal means to provide freedom for the seal means to collapse during actuation.

* * * * *